(12) United States Patent
Holmström

(10) Patent No.: US 7,839,140 B2
(45) Date of Patent: Nov. 23, 2010

(54) POSITION DETECTOR AND METHOD EMPLOYING PLURAL SENSOR UNITS FOR DETECTING A POSITION OF A PACKAGING MATERIAL WITH MAGNETIC MARKING

(75) Inventor: Gert Holmström, Lund (SE)

(73) Assignee: Tetra Laval Holdings & Finance S.A., Pully (CH)

( * ) Notice: Subject to any disclaimer, the term of this patent is extended or adjusted under 35 U.S.C. 154(b) by 536 days.

(21) Appl. No.: 11/815,324

(22) PCT Filed: Jan. 27, 2006

(86) PCT No.: PCT/SE2006/000122

§ 371 (c)(1),
(2), (4) Date: Aug. 2, 2007

(87) PCT Pub. No.: WO2006/093449

PCT Pub. Date: Sep. 8, 2006

(65) Prior Publication Data

US 2008/0309327 A1    Dec. 18, 2008

(30) Foreign Application Priority Data

Mar. 2, 2005    (SE) .................................. 0500473

(51) Int. Cl.
*G01B 7/14* (2006.01)
(52) U.S. Cl. ............................ 324/207.21; 324/207.12; 324/207.24
(58) Field of Classification Search ............. 324/207.21
See application file for complete search history.

(56) References Cited

U.S. PATENT DOCUMENTS

| 4,649,342 | A | | 3/1987 | Nakamura |
| 5,388,014 | A | * | 2/1995 | Brug et al. ..................... 360/66 |
| 5,705,973 | A | * | 1/1998 | Yuan et al. ................. 338/32 R |
| 6,175,296 | B1 | * | 1/2001 | Tokunaga et al. .......... 338/32 R |
| 7,064,537 | B2 | * | 6/2006 | Sudo et al. ............. 324/207.21 |
| 7,378,839 | B2 | * | 5/2008 | Abe et al. ............... 324/207.21 |

FOREIGN PATENT DOCUMENTS

EP    0 317 879 B1    5/1989

OTHER PUBLICATIONS

Form PCT/ISA/210 (International Search Report) dated May 31, 2006.

* cited by examiner

*Primary Examiner*—Jay M Patidar
(74) *Attorney, Agent, or Firm*—Buchanan Ingersoll & Rooney PC

(57) ABSTRACT

A position detector arrangement for detecting a position of a packaging material with magnetic marking comprises a sensor assembly comprising a plurality of magnetic sensor units each comprising an output providing an output signal. The magnetic sensor units are arranged in at least two sensor unit pairs, with the sensor units of each pair arranged with opposite sensitivity directions, and with the sensor units arranged to sense magnetic markings of the packaging material. A signal processing assembly is connected to the outputs of the magnetic sensors and comprises a combiner arranged to aggregate the output signals of the sensors to an aggregated signal; and a detector arranged to determine the position of the packaging material from the aggregated signal. Further, a method for detecting a position of a packaging material with magnetic markings is disclosed.

19 Claims, 8 Drawing Sheets

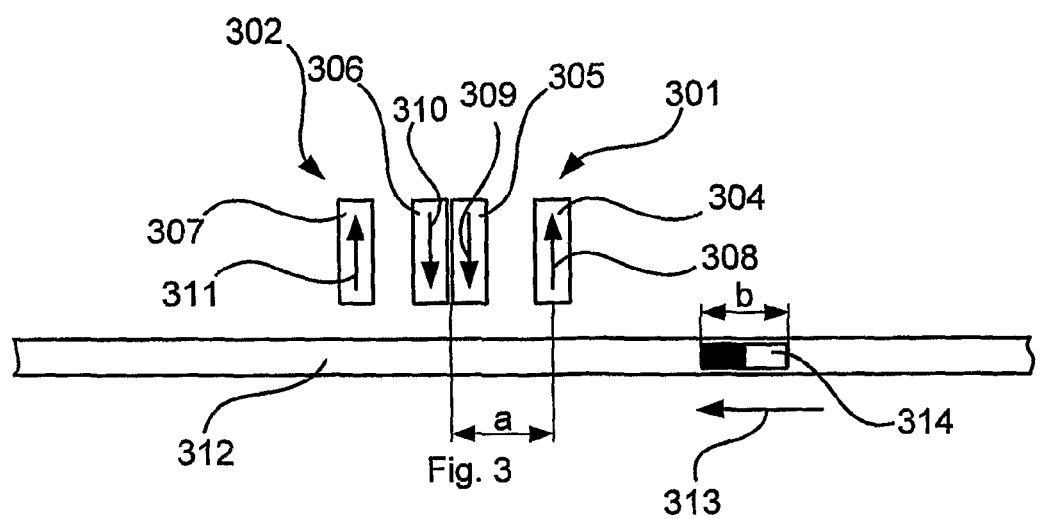
Fig. 4a
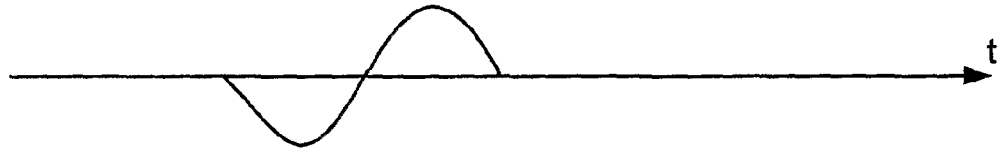
Fig. 4b
Fig. 4c
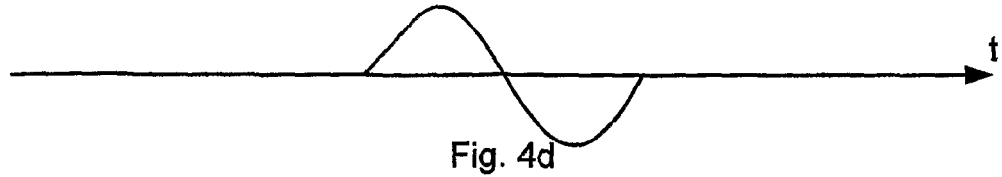
Fig. 4d
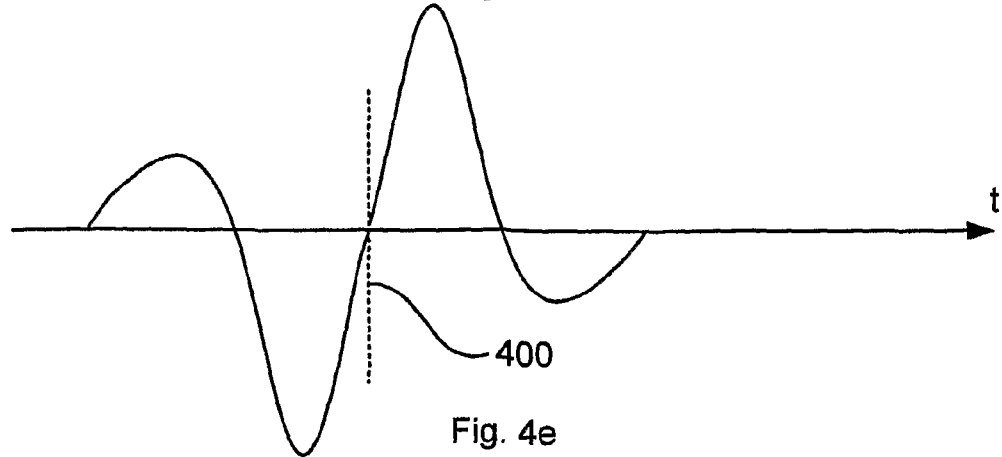
Fig. 4e

POSITION DETECTOR AND METHOD EMPLOYING PLURAL SENSOR UNITS FOR DETECTING A POSITION OF A PACKAGING MATERIAL WITH MAGNETIC MARKING

TECHNICAL FIELD

The present invention relates to a position detector arrangement for determining a position of a packaging material with magnetic marking, and a method for determining a position of a packaging material with magnetic marking.

BACKGROUND OF THE INVENTION

It is known that magnetic sensors or detector elements can be used for establishing and recording the occurrence of magnetic fields and it is also known that magnetic markings can be arranged on a carrier which are readable by magnetic sensors. If a magnetic sensor of known type is used for the detection of magnetic markings which have been applied to e.g. a packaging material web in order to control the forwards feed of the web or control some other working operation, difficulties frequently occur owing to the presence of strong magnetic interference fields. In a packaging machine, for example, sealings are carried out frequently with the help of induction coils which are supplied with heavy currents and which induce strong magnetic fields. Similarly, in modern machines electric machines, e.g. motors and transformers, are present which give rise to substantial magnetic fields. In the European patent no. 317879, it is described a method and arrangement for suppressing the effect of magnetic interference fields during the detection of magnetic marks or markings applied on a carrier. However, there is a need for an improved position detection for determining a position of a packaging material.

SUMMARY OF THE INVENTION

In view of the above, an objective of the invention is to solve or at least reduce the problems discussed above. In particular, an objective is to provide a robust position determination of a packaging material.

The present invention is based on the understanding that the sum of output signals from a plurality of magnetic sensors implies suppression of magnetic interference.

According to a first aspect of the present invention, there is provided a position detector arrangement for detecting a position of a packaging material with magnetic marking, comprising a sensor assembly comprising a plurality of magnetic sensor units each comprising an output providing an output signal, wherein said magnetic sensor units are arranged in at least two sensor unit pairs, the sensor units of each pair are arranged with opposite sensitivity directions, and said sensors are arranged to sense magnetic markings of said packaging material; a signal processing assembly connected to said outputs of said magnetic sensors comprising a combiner arranged to aggregate said output signals of said sensors to an aggregated signal; and a detector arranged to determine said position of said packaging material from said aggregated signal.

An advantage of this is a robust position determination in sense of magnetic interferences from e.g. electric machines and in sense of dust, e.g. from the packaging material. Further, an advantage is that the sensors do not need to be in direct contact with the packaging material. Further, an advantage is simple signal processing.

Each sensor unit pair may comprise one magnetic sensor unit being arranged closer to the packaging material at operation than the other magnetic sensor of the pair.

The sensor units may be Wheatstone bridges comprising magnetoresistive sensors.

The detector may be arranged to determine the position by detecting a zero crossing of the aggregated signal.

The detector may comprise means for detecting a predetermined level of the aggregated signal prior the zero crossing appears. The detector may comprise means for detecting a predetermined change of level of the aggregated signal prior the zero crossing.

These features provides for accurate finding of the zero crossing by either observing the level, or the slope of the signal, or both. These features also enable a fast detection, i.e. no or little latency in providing a detection output signal.

The arrangement may further comprise a first magnetic compensation sensor unit arranged with its sensitivity direction perpendicular to the sensitivity directions of the plurality of magnetic sensor units, and a second magnetic compensation sensor unit arranged with its sensitivity direction perpendicular to the sensitivity directions of the plurality of magnetic sensor units and the first magnetic compensation sensor unit.

The signal processing assembly may be connected to the first and second magnetic compensation sensor units and arranged to suppress signal components from the plurality of magnetic sensor units being perpendicular to the sensitivity direction of the plurality of magnetic sensor units.

The position detector arrangement may comprise adjustment means for said output signals of said magnetic sensor units.

The sensitivity directions of the magnetic sensor units may be parallel and anti-parallel, respectively, to the magnetic orientation of said magnetic marking. Alternatively, the sensitivity directions of the magnetic sensor units may be perpendicular to the magnetic orientation of said magnetic marking.

A quotient between a spacing between two sensor units facing the marking and a size of the marking in the position detection direction is between 0.6 and 3, preferably between 0.7 and 1.8, preferably between 0.85 and 1.4, and preferably about 1.

According to a second aspect of the present invention, there is provided a method for determining a position of a packaging material with magnetic markings, comprising the steps of: generating a plurality of sensor signals responsive to magnetism of said magnetic markings by a plurality of magnetic sensor pairs, each comprising magnetic sensor units being anti-parallelly arranged; aggregating said sensor signals to an aggregated signal; and determining a position from said aggregated signal.

The advantage of this is essentially the same as for the first aspect of the present invention.

The step of determining a position may comprise the steps of: detecting a zero crossing of said aggregate signal; and determining said position from said zero crossing.

The method may further comprise the steps of: generating a first compensation signal dependent on a first magnetism component in a direction perpendicular to said sensitivity directions of said pairs of magnetic sensors; generating a second compensation signal dependent a second magnetism component in a direction perpendicular to said sensitivity directions of said pairs of magnetic sensors and said first magnetism component; and compensating said sensor signals field of said pairs of magnetic sensors for magnetism components perpendicular to said sensitivity directions of said pairs of magnetic sensors by said first and second compensation signals.

The method may further comprise the step of adjusting the outputs of said magnetic sensors.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

The term "magnetism" should be interpreted as any magnetic amount. The term "magnetic sensor" should be interpreted as any device able to detect or measure magnetism. The term "sensitivity direction" means the direction where a positive magnetic amount result in a positive electric output signal. The term "sensor unit pair" should be construed functionally, and not as a matter of number of physical devices.

Other objectives, features and advantages of the present invention will appear from the following detailed disclosure, from the attached dependent claims as well as from the drawings.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein:

FIG. 3 is a schematic diagram illustrating positions of two sensor unit pairs according to an embodiment of the present invention;

FIGS. 4a-4e are signal diagrams schematically illustrating timing of signals when a magnet or magnetized part of a packaging material passes sensor units according to the arrangement illustrated in FIG. 3;

DETAILED DESCRIPTION OF PREFERRED EMBODIMENTS

Figure 1:
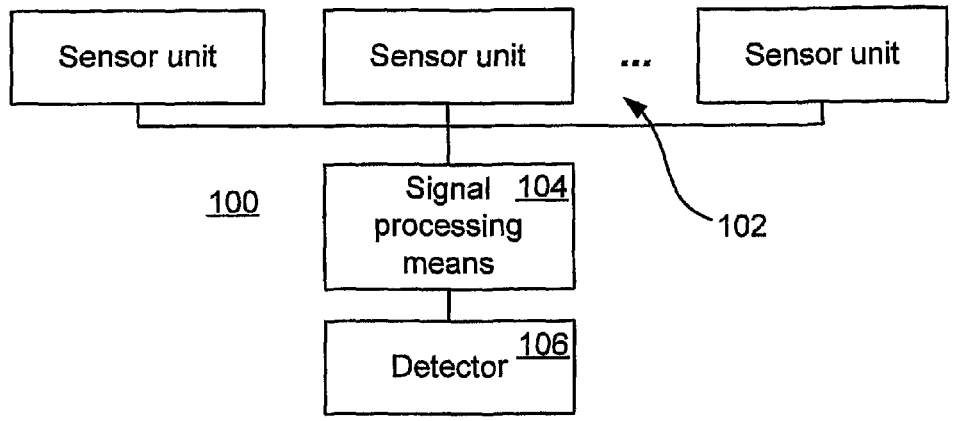
FIG. 1 is a block diagram schematically showing a position determination apparatus according to an embodiment of the present invention.

FIG. 1 is a block diagram schematically showing a position determination apparatus 100 arranged to determine position of a packaging material (not shown) by determining the time when a magnetic marking arranged in, at, or by the material. The apparatus 100 comprises a plurality of sensors 102, which provides output signals responsive to the magnetism of the magnet or magnetic material. The Output signals are aggregated in a signal processing means 104 to produce an aggregated signal, which is provided to a detector 106. The detector 106 determines a position of the magnetic marking from the aggregated signal.

Figure 2:
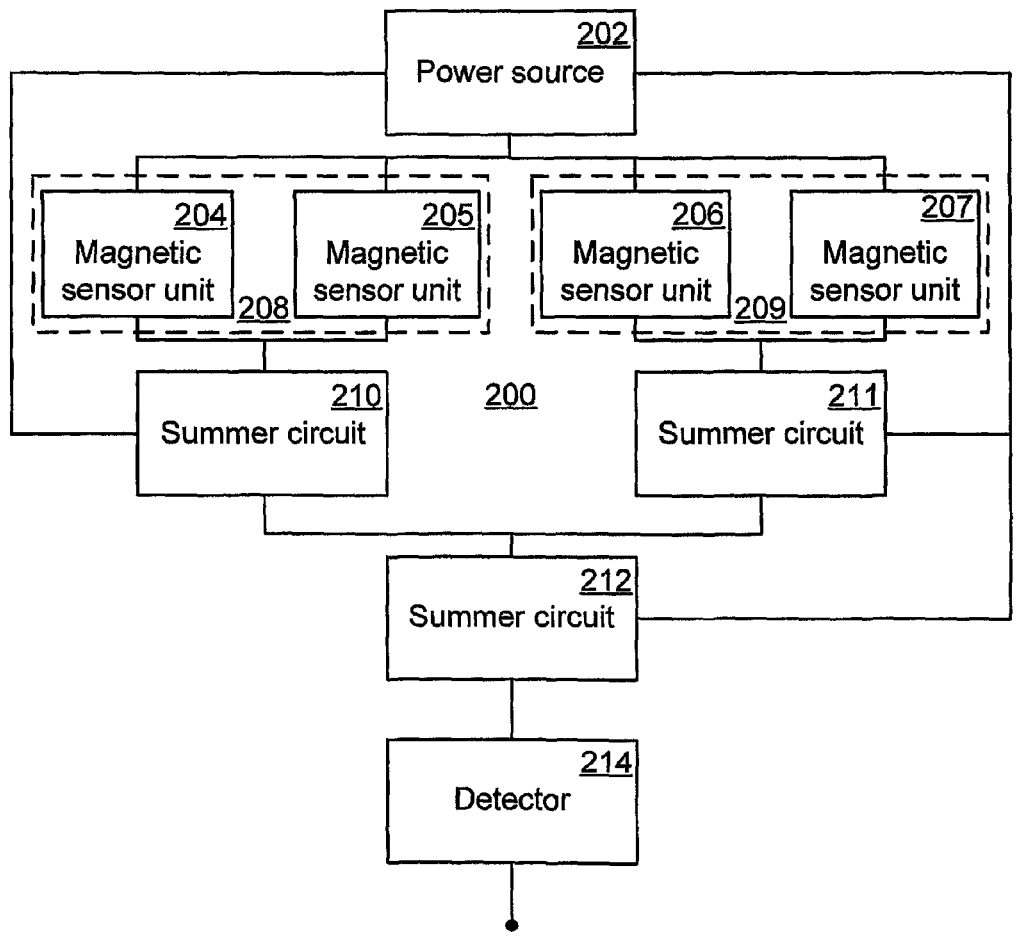
FIG. 2 is a block diagram schematically showing a position determination apparatus according to an embodiment of the present invention.

FIG. 2 is a block diagram schematically showing a position determination apparatus 200 arranged to determine position of a packaging material (not shown) by determining the time when a magnet arranged in, at, or by the material, or a magnetized part of the material passes the apparatus 200. The position determination apparatus 200 comprises a power source 202 for providing electric power to electronics of the apparatus 200. The apparatus 200 comprises a plurality of magnetic sensor units 204, 205, 206, 207 arranged in pairs 208, 209. In each pair 208, 209, one magnetic sensor unit 204, 206 is arranged with its sensitivity direction in one direction, and the other magnetic sensor unit 205, 207 is arranged with its sensitivity direction in the opposite direction, i.e. the magnetic sensors 204, 205, 206, 207 of a pair is anti-parallelly arranged. By sensitivity direction, it is meant the relation between the polarity of the output signal and the direction of the magnetism, i.e. magnetic field or magnetic flow. The outputs of the magnetic sensor units 204, 205, 206, 207 are aggregated in one or more summer circuits 210, 211, 212 to produce an aggregated signal of the output signals of the sensors. The aggregated signal is analyzed in a detector 214 arranged to determine a certain well defined point of the aggregated signal. The well defined point of the aggregated signal can be a center zero crossing of the aggregated signal.

FIG. 3 is a schematic diagram illustrating positions of two sensor unit pairs 301, 302, each comprising two sensor units 304, 305; 306, 307 with anti-parallel sensitivity directions 308, 309; 310, 311, according to an embodiment of the present invention, and a part of a packaging material 312, here moving from right to left as depicted by arrow 313, with a magnet 314 arranged in the material. To achieve output signals from the sensors 304-307 that upon aggregation provides an aggregated signal, from which an easily detectable and well defined zero crossing can be determined, the distance a, with which the sensors of a sensor pair is spaced in the arrangement, is essentially equal to the size b of the magnetic marking, taken in the direction of which the magnetic marking is exposed to the sensors, i.e. the position determination direction. Here, the distance a is the distance between the center of the sensor arrangement and the center of the outer sensor unit 304, since it empirically has been found that this actually will be the effective spacing. This will provide concurrent outputs of the sensors when the magnetic marking is close to the sensors. The quotient a/b between the spacing a of the sensors of a pair and the size b of the magnetic marking is preferably between 0.6 and 3, more preferably between 0.7 and 1.8, further more preferably between 0.85 and 1.4, and most preferably about 1.

FIGS. 4a-4e are signal diagrams illustrating timing of signals when a magnet or magnetized part of a packaging material passes sensor units according to the arrangement illustrated in FIG. 3. FIG. 4a illustrates the output signal of a first sensor unit of a first sensor unit pair when the magnet passes. As a magnetic field is in the same direction as the sensitivity direction of the sensor unit, the output signal has a positive polarity and increases as the magnet approaches. During the passing of the magnet, the output signal decreases as the magnetic field component in the sensitivity direction decreases, to change polarity when the magnetic field component in the sensitivity direction becomes negative. When the magnet passes on, the output signal gradually increases to zero. FIG. 4b illustrates the output signal of a second sensor unit of the first sensor unit pair when the magnet passes. Compared to the output signal of the first sensor unit of the pair illustrated in FIG. 4a, the output signal has opposite polarity due to the anti-parallel arrangement, and is time shifted in time due to the arrangement of the second sensor unit beside the first sensor unit. Interferences from magnetic sources far away, compared to the distance to the marking, such as electric machines, power lines, etc., will give a null result when the output signals from the sensor units of the pair are aggregated, since they have opposite sensitivity directions and are arranged close together, i.e. experience equal interferences. Thus, interferences are suppressed. For the sake of clarity, any interferences are not depicted in the signal diagram, since they might obscure the principle of aggregation of the output signals.

Similar to FIGS. 4a and 4b for the first pair of sensor units, FIGS. 4c and 4d illustrate the output signals of the second pair of sensor units depicted in FIG. 3. FIG. 4c illustrates the output signal of the first sensor unit of the second pair, which due to its sensitivity direction have a shape and polarity similar to the output of the second sensor of the first pair, and, due to the position close to the second sensor of the first pair, where the sensor unit is arranged, is only slightly time shifted, which in FIG. 4c is depicted as a zero time shift. The output signal of the second sensor unit of the second pair, as depicted in FIG. 4d, is similar in shape, but further time shifted and with a polarity similar to the output of the first sensor of the first pair, due to its parallel sensitivity direction. The aggregated signal, comprising the aggregated output signals of the sensor units, is depicted in FIG. 4e. A position is determined from the aggregated signal by determining a zero crossing 400, as will be described below.

Figure 5:
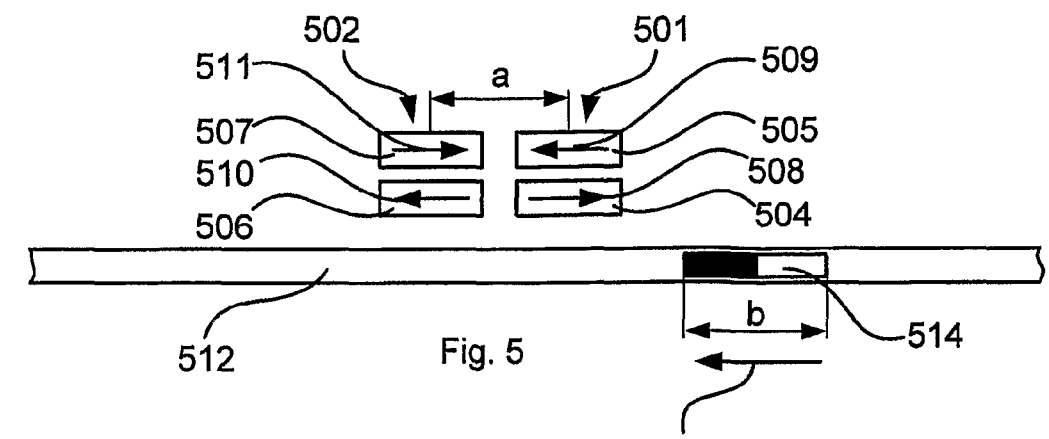
FIG. 5 is a schematic diagram illustrating positions of two sensor unit pairs according to an embodiment of the present invention.
Figure 6A:
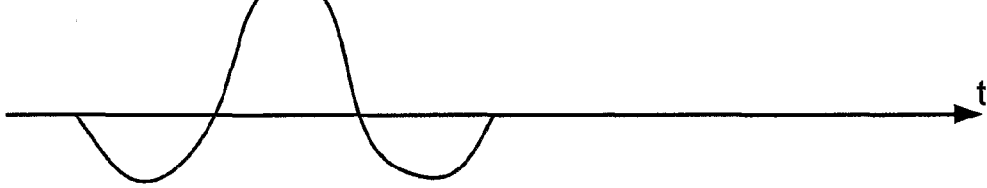
FIGS. 6a-6e are signal diagrams illustrating timing of signals when a magnet or magnetized part of a packaging material passes sensor units according to the arrangement illustrated in FIG. 5.
Figure 6B:
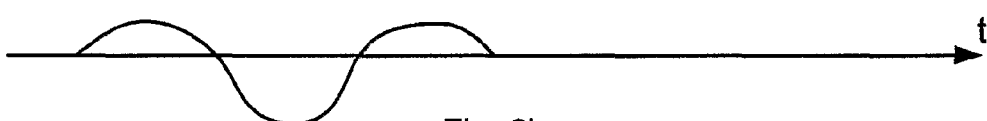

FIG. 5 is a schematic diagram illustrating positions of two sensor unit pairs 501, 502, each comprising two sensor units 504, 505; 506, 507 with anti-parallel sensitivity directions 508, 509; 510, 511, according to an embodiment of the present invention, and a part of a packaging material 512, here moving from right to left as depicted by arrow 513, with a magnet 514 arranged in the material. To achieve output signals from the sensors 504-507 that upon aggregation provides an aggregated signal, from which an easily detectable and well defined zero crossing can be determined, the distance a, with which the sensors of a sensor pair is spaced in the arrangement, is essentially equal to the size b of the magnetic marking, taken in the direction of which the magnetic marking is exposed to the sensors. This will provide concurrent outputs of the sensors when the magnetic marking is close to the sensors. The quotient a/b between the spacing a of the sensors of a pair and the size b of the magnetic marking is preferably between 0.6 and 3, more preferably between 0.7 and 1.8, further more preferably between 0.85 and 1.4, and most preferably about 1. FIGS. 6a-6e are signal diagrams illustrating timing of signals when a magnet or magnetized part of a packaging material passes sensor units according to the arrangement illustrated in FIG. 5. FIG. 6a illustrates the output signal of a first sensor unit of a first sensor unit pair when the magnet passes. As a magnetic field is in the opposite direction to the sensitivity direction of the sensor unit, the output signal is negative and decreases as the magnet approaches. When the magnet is in line with the sensor unit, the output signal increases as the magnetic field component in the sensitivity direction is approximately following the magnetic field lines of the magnet. When the magnet passes on, the output signal gradually decreases to zero, then becomes negative when the magnet has passed the sensor unit, and finally decays to zero when the magnet is far away. FIG. 6b illustrates the output signal of a second sensor unit of the first sensor unit pair when the magnet passes. Compared to the output signal of the first sensor unit of the pair illustrated in FIG. 6a, the output signal has opposite polarity due to the anti-parallel arrangement, and has a smaller absolute value due to the arrangement of the second sensor unit more far away from the marking than the first sensor unit. Interferences from magnetic sources far away, compared to the distance to the marking, such as electric machines, power lines, etc., will give a null result when the output signals from the sensor units of the pair are aggregated, since they have opposite sensitivity directions, and are arranged close together, i.e. experience equal interferences. Thus, interferences are suppressed. For the sake of clarity, any interferences are not depicted in the signal diagram, since they might obscure the principle of aggregation of the output signals.

Figure 6C:
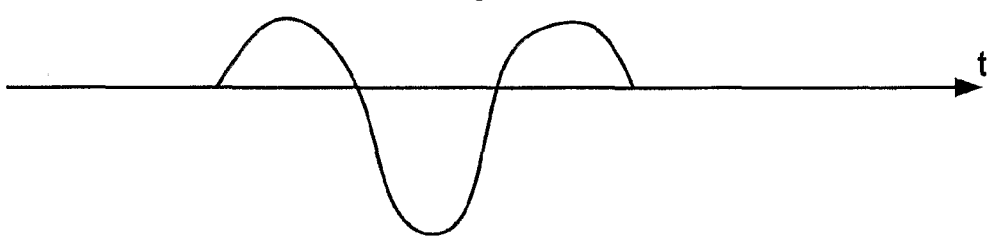
Figure 6D:
Figure 6E:
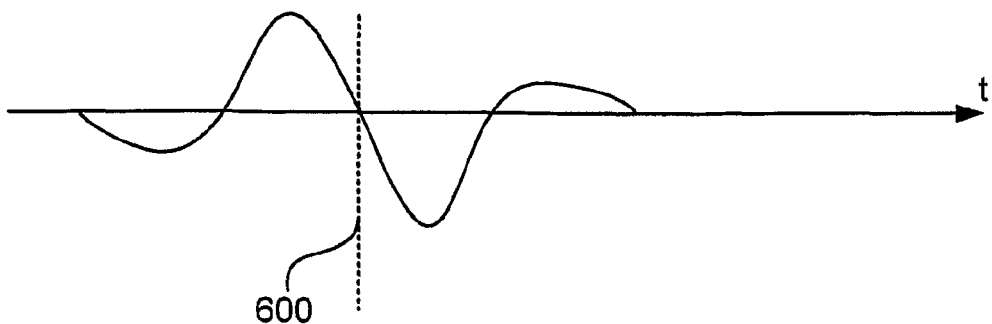

Similar to FIGS. 6a and 6b for the first pair of sensor units, FIGS. 6c and 6d illustrate the output signals of the second pair of sensor units depicted in FIG. 5. FIG. 6c illustrates the output signal of the first sensor unit of the second pair, which have a similar shape, but, due to its sensitivity direction, have polarity opposite to the output of the first sensor of the first pair, and, due to the position where the sensor unit is arranged, is time shifted. The output signal of the second sensor unit of the second pair, as depicted in FIG. 6d, is similar in shape, but further opposite in polarity and with a smaller absolute value similar to the output of the second sensor of the first pair, due to its distance to the marking. The aggregated signal, comprising the aggregated output signals of the sensor units, is depicted in FIG. 6e. A position is determined from the aggregated signal by determining a center zero crossing 600.

Figure 7:
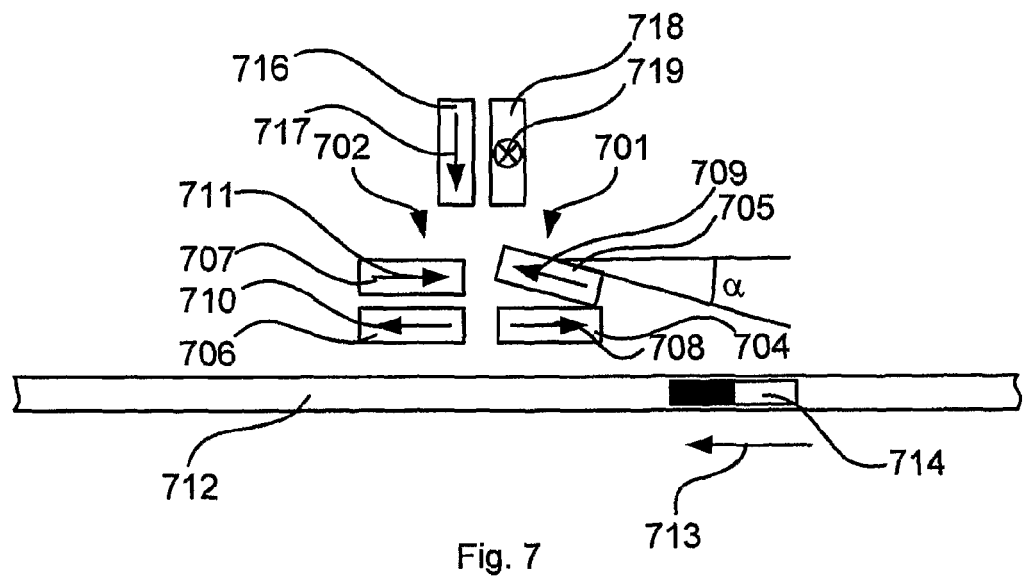
FIG. 7 is a schematic diagram illustrating positions of two sensor unit pairs and compensation sensors according to an embodiment of the present invention.

FIG. 7 is a schematic diagram illustrating positions of two sensor unit pairs 701, 702, each comprising two sensor units 704, 705; 706, 707 with anti-parallel sensitivity directions 708, 709; 710, 711, according to an embodiment of the present invention, and a part of a packaging material 712, here moving from right to left as depicted by arrow 713, with a magnet 714 arranged in the material. In FIG. 7, one of the sensor units 705 is depicted as slightly angled α, i.e. not exactly parallel to the other sensor 704 of the sensor unit pair 702. This has the effect that the sensor unit 705 provides a signal with less suppression of interference according to the sensor pair principle. To compensate for this, a first magnetic compensation sensor unit 716 is arranged with its sensitivity direction 717 perpendicular to the main direction of the sensor units 704, 705, 706, 707 of the sensor unit pairs 701, 702, and a second magnetic compensation sensor unit 718 is arranged with its sensitivity direction 719 perpendicular to the main direction of the sensor units 704, 705, 706, 707 of the sensor unit pairs 701, 702, and the magnetic compensation sensor unit 716. By adding or subtracting values received by compensation sensors 716, 718, any angle deviations of the sensor units 704, 705, 706, 707 of the sensor unit pairs 701, 702 can be compensated.

Figure 8:
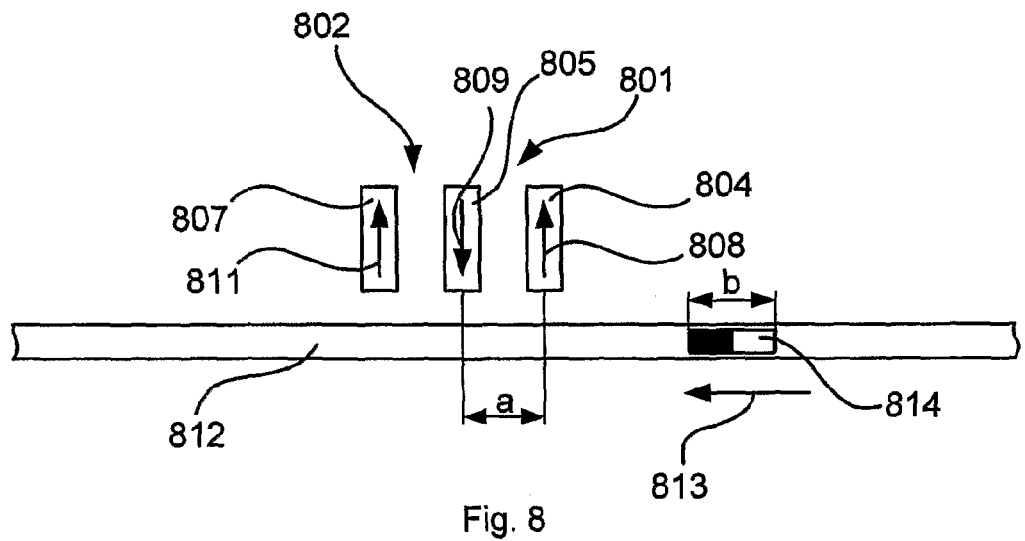
FIG. 8 is a schematic diagram illustrating positions of two sensor unit pairs with a common sensor according to an embodiment of the present invention.

FIG. 8 is a schematic diagram illustrating positions of two sensor unit pairs 801, 802 having one sensor unit 805 in common, and thereby each comprising "two" sensor units 804, 805; 805, 807 with anti-parallel sensitivity directions 808, 809; 809, 811, according to an embodiment of the present invention, and a part of a packaging material 812, here moving from right to left as depicted by arrow 813, with a magnetic marking 814 arranged in the material. To achieve output signals from the sensors 804-807, that upon aggregation provides an aggregated signal, from which an easily detectable and well defined zero crossing can be determined, the distance a, with which the sensors of a sensor pair is spaced in the arrangement, is essentially equal to the size b of the magnetic marking, taken in the direction of which the magnetic marking is exposed to the sensors. This will provide concurrent outputs of the sensors when the magnetic marking is close to the sensors. The quotient a/b between the spacing a of the sensors of a pair and the size b of the magnetic marking is preferably between 0.6 and 3, more preferably between 0.7 and 1.8, further more preferably between 0.85 and 1.4, and most preferably about 1.

Figure 9:
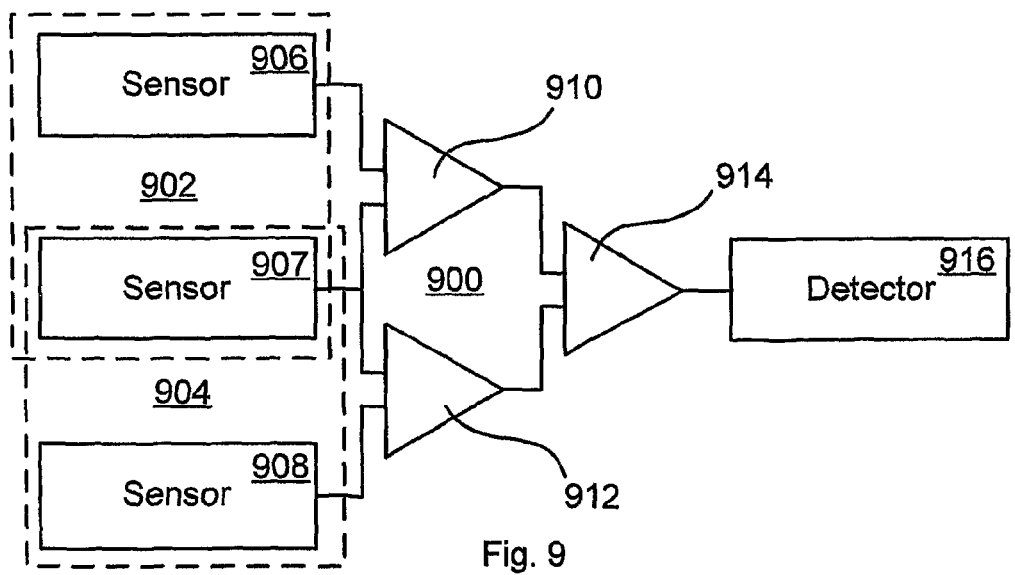
FIG. 9 is a schematic wiring diagram of a position determination apparatus according to the embodiment of the present invention depicted in FIG. 8.

FIG. 9 schematically illustrates wiring of an assembly 900 according to the embodiment shown in FIG. 8. The assembly comprises a first sensor pair 902 and a second sensor pair 904, where the first sensor pair comprises sensors 906, 907, and the second sensor pair 904 comprises sensors 907, 908, i.e. the sensor pairs 902, 904 have the sensor 907 in common. The signals from the first sensor pair 902, i.e. the signals from sensors 906, 907, are aggregated in a first aggregation means 910. The signals from the second sensor pair 904, i.e. the signals from sensors 907, 908, are aggregated in a second aggregation means 912. The aggregated signals from the first and second aggregation means 910, 912 are aggregated in a third aggregation means 914 to provide an aggregated signal from which a detector 916 can determine a position of a magnetic marking.

Figure 10:
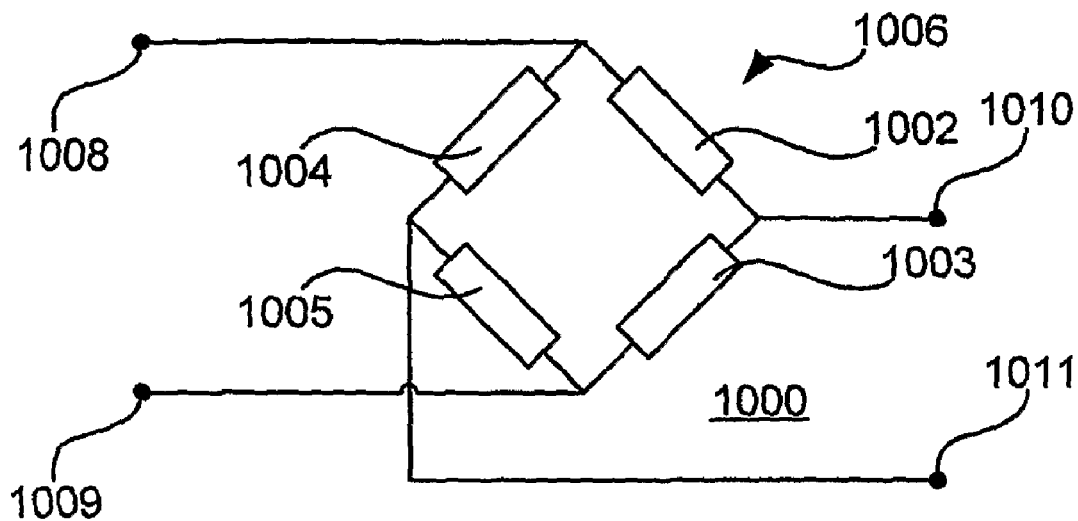
FIG. 10 is an electrical wiring diagram of a magnetic sensor unit according to an embodiment of the present invention.

FIG. 10 is an electrical wiring diagram of a magnetic sensor unit 1000 according to an embodiment of the present invention. The sensor unit 1000 comprises four magnetic sensors 1002, 1003, 1004, 1005 connected to form a Wheatstone bridge 1006. The bridge 1006 is fed at input terminals 1008, 1009 by a driving voltage or driving current, depending on type of the magnetic sensors 1002, 1003, 1004, 1005. The magnetic sensors 1002, 1003, 1004, 1005 can magnetoresistors, Hall sensors, or inductive sensors. An output of the sensor unit 1000 is provided at the output terminals 1010, 1011.

According to an embodiment of the present invention, a sensor unit can comprise a single magnetic sensor. The magnetic sensor can be a magnetoresistor, Hall sensor, or inductive sensor.

Figure 11:
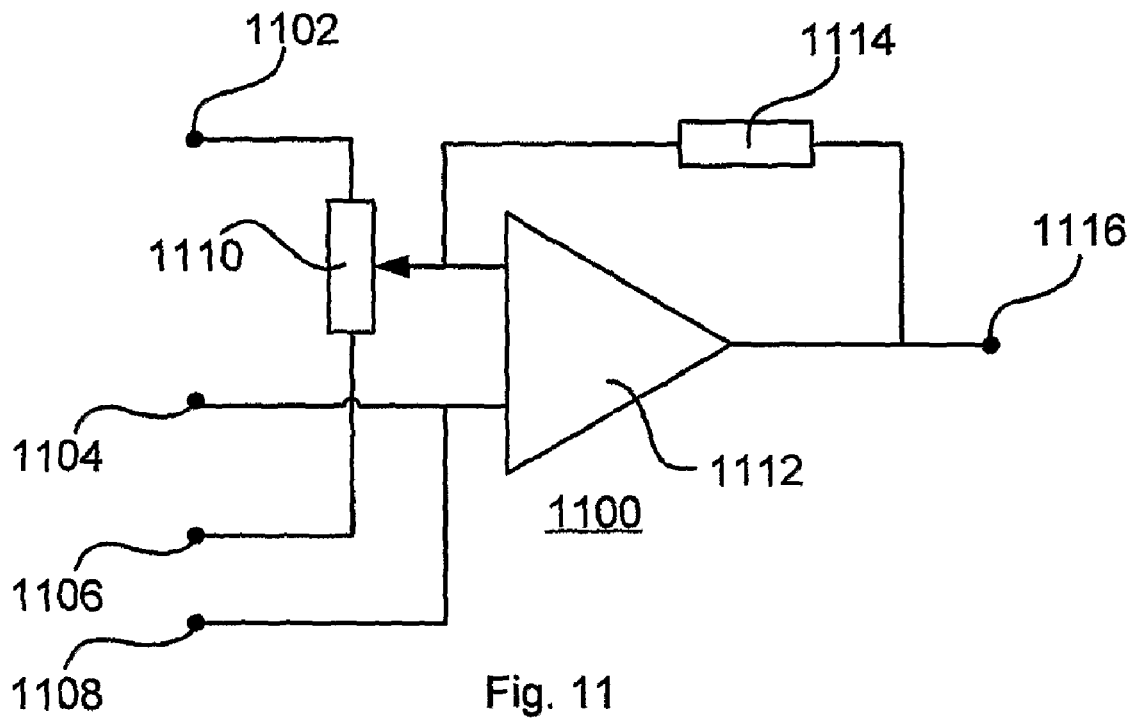
FIG. 11 is an electrical wiring diagram of a summer circuit according to an embodiment of the present invention.

FIG. 11 is an electrical wiring diagram of a summer circuit 1100 according to an embodiment of the present invention, arranged to aggregate output signals from two sensor units. The output signals from a first sensor unit is provided to input terminals 1102, 1104 of the summer circuit 1100, and the output signals from a second sensor unit is provided to input terminals 1106, 1108 of the summer circuit 1100. A potentiometer 1110 can be used as a variable voltage divider, connected between input terminals 1102, 1106, each connected to one sensor unit. The potentiometer 1110 is used to balance the input signals of the two sensors. The wiper terminal of the potentiometer 1110 is connected to an input of an amplifier 1112, e.g. an operational amplifier. The other input of the amplifier 1112 is connected to input terminals 1104, 1108, each connected to one sensor unit. Preferably, the amplifier stage has a feedback resistor 1114 to control the gain. At an output terminal 1116, an aggregated signal of the output signals of the sensor units is provided.

Figure 12:
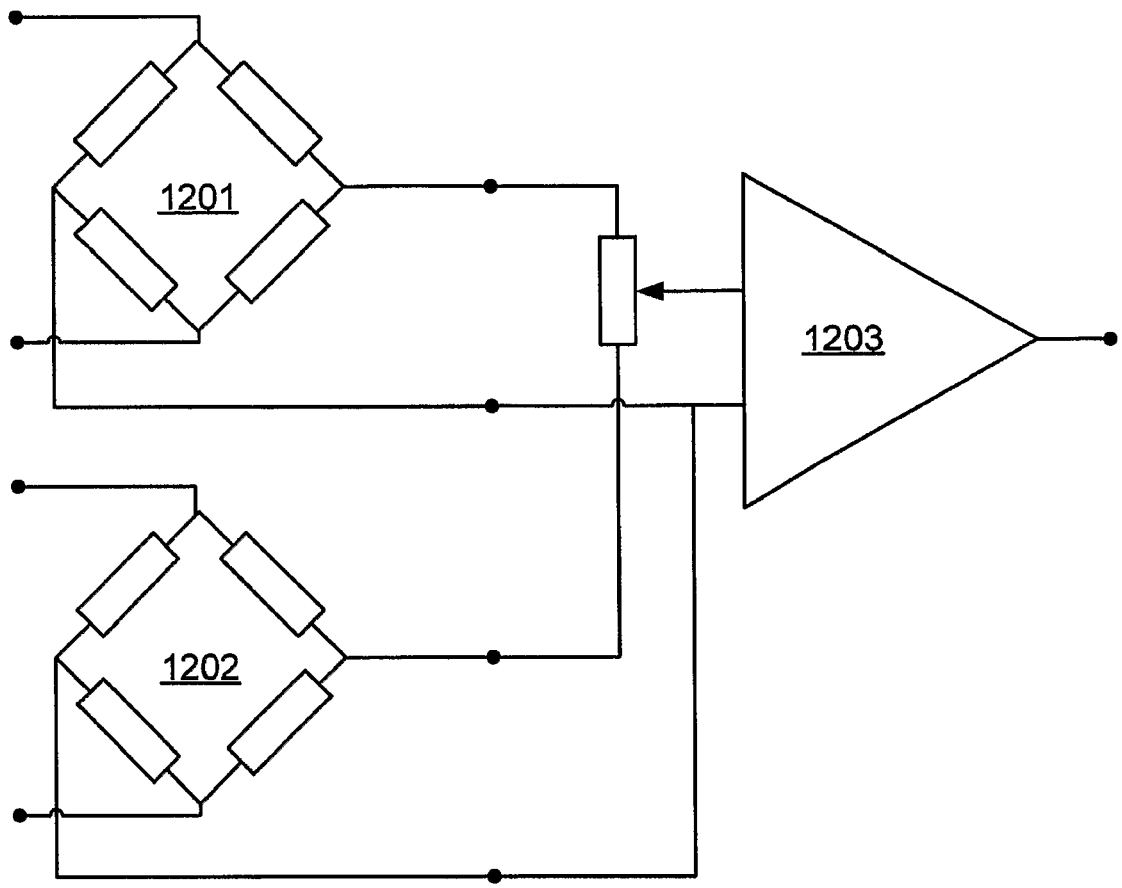
FIG. 12 schematically illustrates the assembled wiring of two sensor units and a summer according to an embodiment of the present invention.

FIG. 12 schematically illustrates the assembled wiring of two sensor units 1201, 1202, and a summer 1203.

Figure 13:
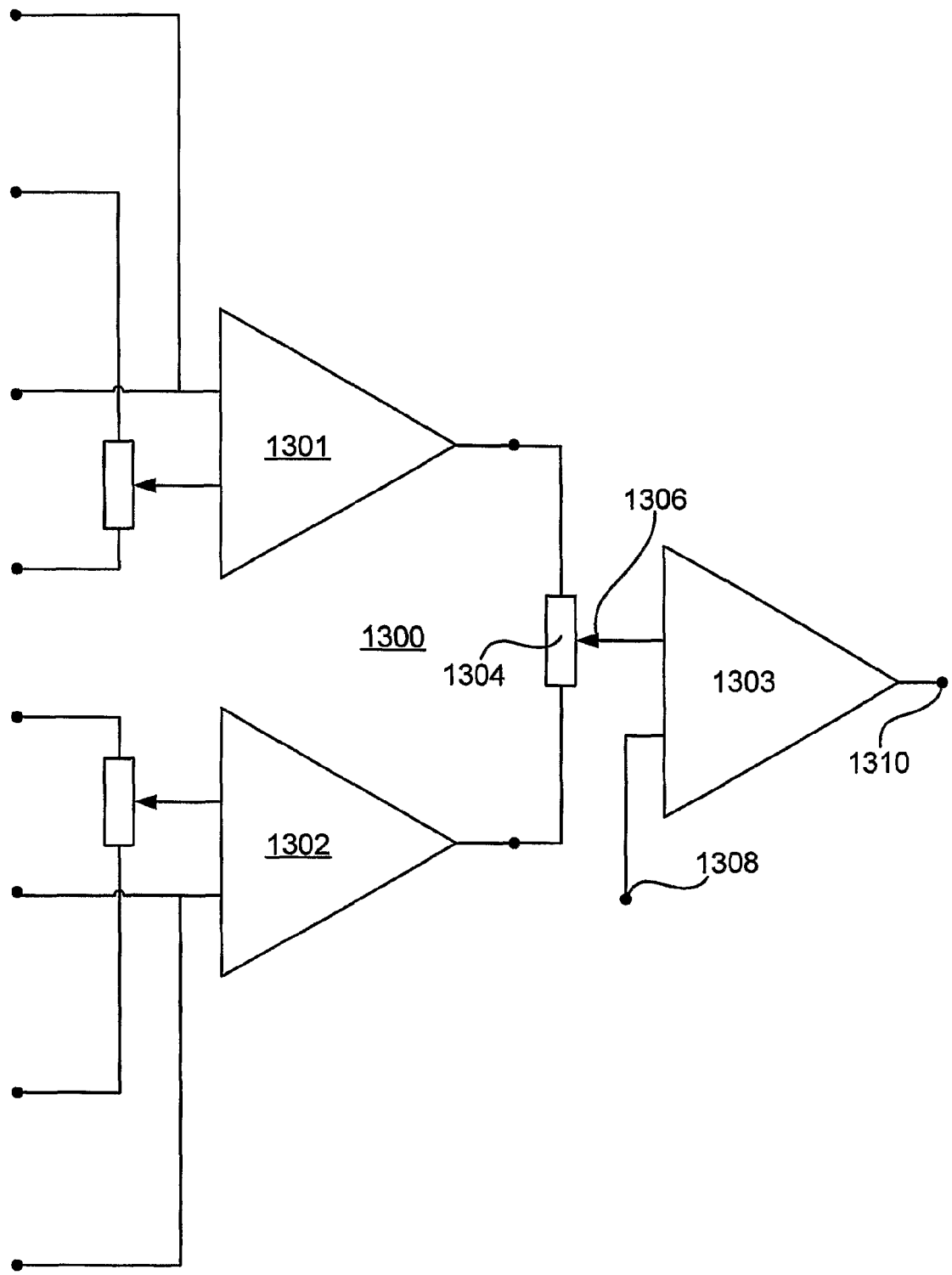
FIG. 13 is a schematic wiring diagram of a summer circuit according to an embodiment of the present invention.

FIG. 13 is a schematic wiring diagram of a summer circuit 1300, comprising a first summer 1301 and a second summer 1302, each connected to two sensor units (not shown), and a third summer 1303 connected to said first and second summers 1301, 1302. A potentiometer 1304 can be used as a variable voltage divider, connected between outputs of the first and second summer 1301, 1302. The potentiometer 1304 is used to balance the signals from the first and second summers 1301, 1302. The wiper terminal 1306 of the potentiometer 1304 is connected to an input of the third summer 1303. The other input 1308 of the summer is connected to an active zero generator (not shown), or to ground. At an output terminal 1310, an aggregated signal of the output signals of the sensor units is provided.

Figure 14:
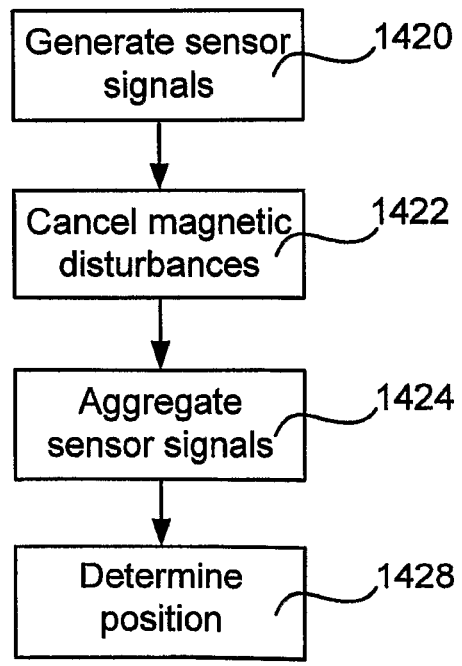
FIG. 14 is a flow chart of a method for determining a position of a packaging material with magnetic markings according to an embodiment of the present invention.

FIG. 14 is a flow chart of a method for determining a position of a packaging material with magnetic markings according to an embodiment of the present invention. In a sensor signal generating step 1420, a plurality of sensor signals responsive to magnetism, e.g. magnetic field or magnetic flow, from said magnetic markings of said packaging material. The sensor signals are generated by a plurality of magnetic sensor units, each comprising a pair of magnetic sensors being anti-parallelly arranged close to each other. In a magnetic interference suppressing step 1422, magnetic interferences from magnetic sources far away, compared to the distance to the marking, are suppressed by aggregating the sensor signals of each of the sensors of the sensor pairs. Thereby, by the anti-parallel arrangement, interferences from sources far away are suppressed. In a sensor signal aggregation step 1424, all the sensor signals from the sensor pairs are aggregated to form an aggregated signal. In a position determination step 1428, the position is determined from the aggregated signal.

Figure 15:
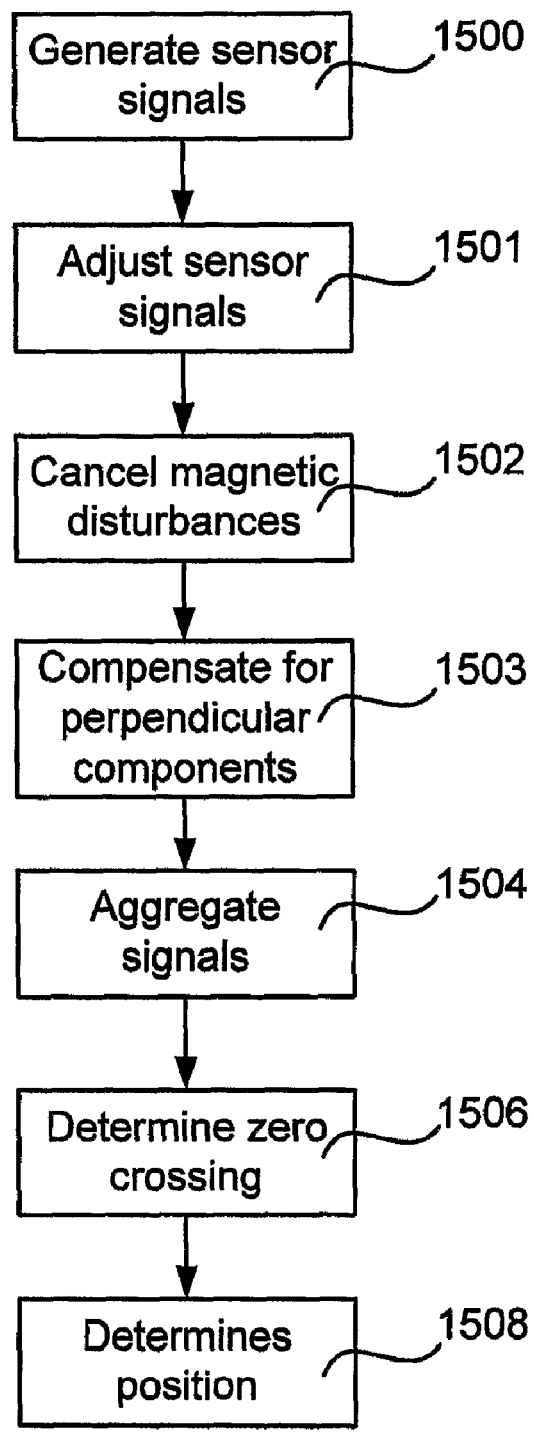
FIG. 15 is a flow chart of a method for determining a position of a packaging material with magnetic markings according to an embodiment of the present invention.

FIG. 15 is a flow chart of a method for determining a position of a packaging material with magnetic markings according to an embodiment of the present invention. In a sensor signal generating step 1500, a plurality of sensor signals responsive to magnetism, e.g. magnetic field or magnetic flow, from said magnetic markings of said packaging material are generated. The sensor signals are generated by a plurality of magnetic sensor units, each comprising a pair of magnetic sensors being anti-parallelly arranged close to each other. In a sensor signal adjustment step 1501, the signals of the sensor units are adjusted to be balanced, i.e. the level of the signals are equal for a certain level of magnetism exposure. In a magnetic interference suppressing step 1502, magnetic interferences from magnetic sources far away, compared to the distance to the marking, are suppressed by aggregating the sensor signals of each of the sensors of the sensor pairs. Thereby, by the anti-parallel arrangement, interferences from sources far away are suppressed. In a compensation step 1503, the sensor signals are adjusted for the case that the sensitivity direction of any of the sensor units are not aligned. This can be the case when any sensor is not exactly arranged in line with the other sensors. The compensation step 1503 is performed by determining magnetism in a first perpendicular direction, i.e. perpendicular to the intended sensitivity direction of the sensors of the sensor pairs, and in a second perpendicular direction, i.e. perpendicular to the intended sensitivity direction of the sensors of the sensor pairs and to the first perpendicular direction. The sensor signals can then be compensated for magnetism in the first and second perpendicular directions. In a sensor signal aggregation step 1504, all the sensor signals from the sensor pairs are aggregated to form an aggregated signal. In a zero crossing determination step 1506, a zero crossing of the aggregated signals is determined. By "zero" it is meant a certain predetermined level, which can be ground or an active zero level generated by a zero level generator. In a position determination step 1508, the position is determined from determined timing of the zero crossing.

Thus, position detection of packaging material can be provided at production of the packaging material, e.g. for printing, at production of packages of the packaging material, e.g. for getting printed text and images, openings, etc. correct in a packing machine, and at handling of the made packages, e.g. for applying resealable means, stickers, etc. The invention enables synchronisation with good accuracy for these kind of operations. Further, any of the features from the above described embodiments can be used in combination.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A position detector arrangement for detecting a position of a packaging material with magnetic marking, comprising
    a sensor assembly comprising a plurality of magnetic sensor units each comprising an output providing an output signal, wherein said magnetic sensor units are arranged in at least two sensor unit pairs, the sensor units of each pair are arranged with opposite sensitivity directions, and said sensor units are arranged to sense magnetic markings of said packaging material;
    a signal processing assembly connected to said outputs of said magnetic sensors comprising a combiner arranged to aggregate said output signals of said sensors to an aggregated signal;
    a detector arranged to determine said position of said packaging material from said aggregated signal;
    a first magnetic compensation sensor unit arranged with its sensitivity direction perpendicular to said sensitivity directions of said plurality of magnetic sensor units; and
    a second magnetic compensation sensor unit arranged with its sensitivity direction perpendicular to said sensitivity directions of said plurality of magnetic sensor units and said first magnetic compensation sensor unit.

2. The arrangement according to claim 1, wherein each sensor unit pair comprises one magnetic sensor unit being arranged closer to the packaging material than the other magnetic sensor of the pair.

3. The arrangement according to claim 2, wherein said detector is arranged to determine said position by detecting a zero crossing of said aggregated signal.

4. The arrangement according to claim 1, wherein said sensor units are Wheatstone bridges comprising magnetoresistive sensors.

5. The arrangement according to claim 1, wherein said detector is arranged to determine said position by detecting a zero crossing of said aggregated signal.

6. The arrangement according to claim 5, wherein said detector comprises means for detecting a predetermined level of said aggregated signal prior said zero crossing appears.

7. The arrangement according to claim 5, wherein said detector comprises means for detecting a predetermined change of level prior said zero crossing appears.

8. The arrangement according to claim 1, wherein said signal processing assembly is connected to said first and second magnetic compensation sensor units and arranged to suppress signal components from said plurality of magnetic sensor units being perpendicular to said sensitivity direction of said plurality of magnetic sensor units.

9. The arrangement according to claim 1, comprising adjustment means for adjusting said output signals of said magnetic sensor units.

10. The arrangement according to claim 1, wherein the sensitivity directions of the magnetic sensor units are parallel and anti-parallel, respectively, to the magnetic orientation of said magnetic marking.

11. The arrangement according to claim 1, wherein the sensitivity directions of the magnetic sensor units are perpendicular to the magnetic orientation of said magnetic marking.

12. The arrangement according claim 1, wherein a quotient between a spacing between two sensor units facing said marking and a size of said magnetic marking in a position detection direction is between 0.6 and 3.

13. A method for detecting a position of a packaging material with magnetic markings, comprising:
    generating a plurality of sensor signals responsive to magnetism of said magnetic markings by a plurality of magnetic sensor pairs, each comprising magnetic sensor units being anti-parallelly arranged;
    generating a first compensation signal dependent on a first magnetism component in a direction perpendicular to said sensitivity directions of said pairs of magnetic sensors;
    generating a second compensation signal dependent a second magnetism component in a direction perpendicular to said sensitivity directions of said pairs of magnetic sensors and said first magnetism component;
    compensating said sensor signals field of said pairs of magnetic sensors for magnetism components perpendicular to said sensitivity directions of said pairs of magnetic sensors by said first and second compensation signals;
    aggregating said sensor signals to an aggregated signal; and
    determining a position from said aggregated signal.

14. The method of claim 13, wherein said step of determining a position comprises:
    detecting a zero crossing of said aggregated signal; and
    determining said position from said zero crossing.

15. The method according to claim 13, further comprising adjusting outputs of said magnetic sensors.

16. A position detector arrangement for detecting a position of a packaging material with magnetic marking, comprising
    a sensor assembly comprising a plurality of magnetic sensor units each comprising an output providing an output signal, wherein said magnetic sensor units are arranged in at least two sensor unit pairs, the sensor units of each pair are arranged with opposite sensitivity directions, and said sensor units are arranged to sense magnetic markings of said packaging material;

a signal processing assembly connected to said outputs of said magnetic sensors comprising a combiner arranged to aggregate said output signals of said sensors to an aggregated signal; and a detector arranged to determine said position of said packaging material from said aggregated signal, wherein a quotient between a spacing between two sensor units facing said marking and a size of said magnetic marking in a position detection direction is between 0.6 and 3.

17. The arrangement according to claim 16, wherein a quotient between a spacing between two sensor units facing said marking and a size of said magnetic marking in a position detection direction is between 0.7 and 1.8.

18. The arrangement according to claim 16, wherein a quotient between a spacing between two sensor units facing said marking and a size of said magnetic marking in a position detection direction is between 0.85 and 1.4.

19. The arrangement according to claim 16, wherein a quotient between a spacing between two sensor units facing said marking and a size of said magnetic marking in a position detection direction is about 1.

* * * * *